(12) United States Patent
Yamakawa et al.

(10) Patent No.: US 8,053,066 B2
(45) Date of Patent: Nov. 8, 2011

(54) CONDUCTIVE PASTE AND WIRING BOARD USING SAME

(75) Inventors: Masahiro Yamakawa, Osaka (JP); Kenji Miyazaki, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 935 days.

(21) Appl. No.: 11/887,844

(22) PCT Filed: Jan. 18, 2007

(86) PCT No.: PCT/JP2007/050716
§ 371 (c)(1),
(2), (4) Date: Oct. 4, 2007

(87) PCT Pub. No.: WO2007/083710
PCT Pub. Date: Jul. 26, 2007

(65) Prior Publication Data
US 2009/0042001 A1    Feb. 12, 2009

(30) Foreign Application Priority Data
Jan. 20, 2006 (JP) ................................ 2006-012687

(51) Int. Cl.
*B32B 7/02* (2006.01)

(52) U.S. Cl. ........ 428/220; 428/212; 252/512; 252/513; 252/514

(58) Field of Classification Search ................ 428/220, 428/212; 252/512, 513, 514
See application file for complete search history.

(56) References Cited

U.S. PATENT DOCUMENTS

| | | | |
|---|---|---|---|
| 5,242,623 A | 9/1993 | Morrison, Jr. | |
| 6,355,187 B1 * | 3/2002 | Sanada et al. | 252/518.1 |
| 6,627,120 B2 * | 9/2003 | Shimizu | 252/521.2 |
| 7,176,152 B2 * | 2/2007 | Brown et al. | 501/16 |
| 7,267,713 B2 * | 9/2007 | Adachi | 106/13 |
| 7,368,070 B2 * | 5/2008 | Akimoto et al. | 252/512 |
| 2004/0144205 A1 | 7/2004 | Matsuno et al. | |
| 2007/0051927 A1 | 3/2007 | Itoh et al. | |

FOREIGN PATENT DOCUMENTS

| | | |
|---|---|---|
| JP | 5-198207 | 8/1993 |
| JP | 6-228442 | 8/1994 |
| JP | 6-231613 | 8/1994 |
| JP | 6-334351 | 12/1994 |
| JP | 9-310006 | 12/1997 |
| JP | 2001-014943 | 1/2001 |
| JP | 2004-139838 | 5/2004 |
| JP | 2004-228094 | 8/2004 |
| JP | 2005-174698 | 6/2005 |
| JP | 2005-294254 | 10/2005 |
| JP | 2006-331788 | 12/2006 |
| WO | WO 2005/037465 A1 | 4/2005 |

OTHER PUBLICATIONS

Yamakawa et al, JP 2006-331788 machine translation, Jul. 12, 2006.*
International Preliminary Report on Patentability and Written Opinion of the International Searching Authority, issued in corresponding International Patent Application No. PCT/JP2007/050716, mailed on Jul. 31, 2008.

* cited by examiner

*Primary Examiner* — David Sample
*Assistant Examiner* — Lawrence Ferguson
(74) *Attorney, Agent, or Firm* — McDermott Will & Emery LLP

(57) ABSTRACT

A conductive paste contains metal powder, an inorganic binder, and an organic vehicle as main ingredients. The organic vehicle includes a solvent having a boiling point of 270° C. or higher, and the proportion of the solvent with respect to the entire solvent included in the organic vehicle is 3 to 100% by weight.

7 Claims, No Drawings

CONDUCTIVE PASTE AND WIRING BOARD USING SAME

RELATED APPLICATIONS

This application is the U.S. National Phase under 35 U.S.C. §371 of International Application No. PCT/JP2007/050716, filed on Jan. 18, 2007, which in turn claims the benefit of Japanese Application No. 2006-012687, filed on Jan. 20, 2006, the disclosures of which Applications are incorporated by reference herein.

TECHNICAL FIELD OF THE INVENTION

The present invention relates to a conductive paste used when forming conductor wiring on a substrate, and to a wiring board formed using the conductive paste.

BACKGROUND OF THE INVENTION

Since a conductive paste containing metal powder has good conductivity, the conductive paste is widely used for components of a variety of electronic devices. The conductive paste is used for forming conductor wiring of a wiring board. As the conductive paste, for Example, a paste formed by dispersing metal powder and an inorganic binder in an organic vehicle is used. To form conductor wiring, first, the conductive paste is applied to, for Example, a ceramic or a glass substrate in a predetermined pattern using a screen printer, a dispenser, and the like. Then, the applied conductive paste is baked at a high temperature so that the organic vehicle evaporates and the metal powder sinters. This forms a continuous membrane having good conductivity.

Since components of electronic devices have been densely packed, there is a need for efficiently forming a minute wiring pattern (fine pattern). More specifically, it is required to accurately form a fine pattern having a line width and a line interval of 100 µm or less. Therefore, a conductive paste for improving the accuracy of the fine pattern has been disclosed.

Patent Document 1 proposes a conductive paste, which contains spherical conductive powder having an average particle size of 0.8 µm or less and an organic vehicle. The ratio ($D_{50}/D_{min}$) between the median value $D_{50}$ of the particle size of the conductive powder and the minimum value $D_{min}$ of the detectable particle size of the conductive powder is in the range of 2 to 5. Since using this conductive paste reduces waviness of the surface of a conductive pattern, a fine pattern having excellent shape accuracy is obtained. According to the above publication, the ratio ($V_{1rpm}/V_{10rpm}$) between the viscosity $V_{1rpm}$ measured with a Brookfield rotational viscometer using a No. 4 spindle at 1 rpm and the viscosity $V_{10rpm}$ measured with the same instrument at 10 rpm is preferably 2 to 5. Because of this characteristic, the conductive paste does not easily sag after being applied in a predetermined pattern. Thus, the form of the coated film is reliably maintained.

Also, Patent Document 2 proposes a conductive paste, which contains spherical metal powder having a particle size of 100 µm or less and a heat curable phenol resin as a binder resin. The conductive paste includes 0.01 to 5 wt % of a polyethylene resin with respect to 100 parts by weight of the metal powder. By using such a conductive paste, a fine pattern having excellent shape accuracy is formed, and therefore a high quality and high accuracy conductive circuit is manufactured.

In general, the wiring resistance of the conductive paste is required to be reduced for use in forming wiring with the conductive paste. To reduce the wiring resistance, it is effective to form a conductor wiring with a wide line width. However, widening the line width is often difficult due to the design, and there is a strong demand for narrowing the line width. Therefore, to reduce the wiring resistance, the thickness of the coated film must be increased in addition to reducing the volume resistivity of the conductive paste. Also, to increase the conductivity of the wiring, the conductive paste is required to be sufficiently sintered. However, the shrinkage rate of the conductive paste during drying and sintering is great, and the thickness after sintering is reduced to approximately 20% of the thickness when being applied. To suppress shrinkage, the proportion of the solid content such as the metal powder and the inorganic binder in the conductive paste may be increased.

However, in the conventional conductive paste, if the proportion of the solid content in the conductive paste is increased, the amount of the organic vehicle is relatively reduced. Therefore, the viscosity of the conductive paste is increased due to evaporation of a solvent in the organic vehicle, which affects the applying property of the conductive paste. For example, when forming a fine pattern on the wiring board by screen printing, a screen printing plate having a mesh with small openings is used. In this case, the increased viscosity of the conductive paste hinders the conductive paste from passing through the screen printing plate. This causes clogging of the screen printing plate. Thus, thin spots or disconnection might be created in the wiring, making it difficult to accurately form a fine pattern of 100 µm or less. In particular, when continuously printing for a long time, thin spots or disconnection are easily formed, making it even more difficult to accurately form a fine pattern. Also, when forming a fine pattern using a dispenser, the same problems as in the case of the screen printing occur since a nozzle with a small opening is used.

Patent Document 1: Japanese Laid-Open Patent Publication No. 2004-139838
Patent Document 2: Japanese Laid-Open Patent Publication No. 9-310006

SUMMARY OF THE INVENTION

Accordingly, it is an objective of the present invention to provide a conductive paste that can be used for forming a fine pattern with excellent shape accuracy, and a wiring board using the same.

To achieve the above objective, and in accordance with a first aspect of the present invention, a conductive paste including a metal powder, an inorganic binder, and an organic vehicle as main ingredients is provided. The organic vehicle includes a solvent having a boiling point of 270° C. or higher. The proportion of the solvent with respect to an entire solvent included in the organic vehicle is 3 to 100% by weight.

With this configuration, since a solvent having a high boiling point is used, the desiccation resistance of the conductive paste is improved. Also, even if the proportion of the solid content such as metal powder and an inorganic binder in the conductive paste is increased to increase the thickness of the coated film, increase in the viscosity of the conductive paste is effectively suppressed. Therefore, when forming a fine pattern by screen printing, the conductive paste easily passes through the screen printing plate, and clogging of the screen printing plate is suppressed. Thus, thin spots or disconnection are prevented from being created in the wiring, and a fine pattern is accurately formed when printing continuously.

In the above-mentioned conductive paste, the total content of the metal powder and the inorganic binder with respect to the entire conductive paste is preferably 80% by weight or more. With this configuration, shrinkage of the coated film during drying and sintering of the conductive paste is effectively suppressed. Thus, the thickness of the printed conductive paste is increased.

In the above mentioned conductive paste, the metal powder preferably include powder having an average primary particle size of 50 nm or less, and the proportion of the powder is preferably 1 to 50% by weight of the entire metal powder. In this case, since the packing density of the metal powder is increased, high conductivity is obtained although the conductive paste is sintered at a low temperature (for example, 450° C. or lower), and the thickness of the coated film is increased. Also, when forming a fine pattern by screen printing, the density of the metal powder in the wiring is maintained more uniform. Therefore, a low density portion of the metal powder is not formed at a line edge portion of the fine pattern. This suppresses increase in the volume resistance of the wiring, and as a result, a fine pattern having high conductivity is formed.

In the above-mentioned conductive paste, the metal powder is preferably selected from elemental metals, alloys, and composite metals, and is preferably one or more types of metal or alloy selected from platinum, gold, silver, copper, nickel, and palladium. In particular, from the point of view of the conductivity and reliability, silver is more preferred.

Also, in consideration of environment, glass powder that does not contain lead as the inorganic binder is preferably used.

To achieve the above objective, a second aspect of the present invention provides a wiring board including wiring formed by printing the above-mentioned conductive paste on a base material. With this configuration, by using the above-mentioned conductive paste, for example, a wiring board is obtained that includes wiring having an excellent shape accuracy formed by screen printing.

Also, by using the above-mentioned conductive paste, the desiccation resistance of the conductive paste is improved, and a fine pattern is accurately formed. Thus, the conductive paste is used for manufacturing a wiring board including a fine pattern having a line width of 100 μm or less. In this case, the line width of the entire wiring on the wiring board need not be 100 μm or less, but only the line width of part of the wiring may be 100 μm or less.

DETAILED DESCRIPTION OF THE PREFERRED EMBODIMENTS

A preferred embodiment of the present invention will now be described.

A conductive paste of the present invention contains an organic vehicle, metal powder, and an inorganic binder as main ingredients. The organic vehicle is a mixture of a resin and a solvent. The organic vehicle is required to have the property of maintaining a state where the metal powder and the inorganic binder are evenly dispersed. Also, the organic vehicle is required to have the property of suppressing blurring and running of the printing pattern while permitting the conductive paste to easily pass through the screen printing plate by maintaining the conductive paste to be uniform in quality when applying the conductive paste on a base material by screen printing. Also, in view of preventing degradation of the conductivity, the organic vehicle is selected that does not generate pyrolysate (carbide) in the coated film when the conductive paste is baked. Therefore, from these aspects, a solvent in which a cellulose resin or an acrylic resin is dissolved is preferable. As the resin, for example, a cellulose resin such as methylcellulose, ethylcellulose, nitrocellulose, acetic acid cellulose, and cellulose propionate, acrylic esters such as (meta) methyl acrylate, (meta) ethyl acrylate, and (meta) propyl acrylate, an alkyd resin, and a polyvinyl alcohol are preferred, and in view of safety and stability, ethylcellulose is particularly preferred. These resins may also be mixed, but from the point of views described above, as resin, the content of ethylcellulose in the total amount of the resin component is preferably 60% by weight or more, and is particularly preferably 80% by weight or more and 100% by weight or less.

Also, as the solvent contained in the organic vehicle, a solvent that is soluble in resin and non-corrosive to the base material is used. As the solvent, more specifically, aromatic hydrocarbons such as toluene (boiling point: 110° C.), xylene (boiling point: 138° C. to 144° C.), ethylbenzene (boiling point: 136° C.), diethylbenzene (boiling point: 181° C. to 184° C.), amylbenzene (boiling point: 205° C.), alcohols such as terpineol (boiling point: 219° C.), 2-methoxyethanol (boiling point: 125° C.), 2-ethoxyethanol (boiling point: 136° C.), 2-butoxyethanol (boiling point: 170° C.), diethylene glycol monomethyl ether (boiling point: 194° C.), diethylene glycol monobutyl ether (boiling point: 230° C.), and 2-(2-ethoxy ethoxy) ethyl acetate (boiling point: 217° C.) are generally used.

However, these solvents with low boiling points easily evaporate and are easily dried. Therefore, by using the solvent having a low boiling point, the viscosity of the conductive paste is easily increased. Therefore, if a screen printing plate having a mesh with small openings is used when forming a fine pattern by screen printing, the increased viscosity of the conductive paste hinders the conductive paste from passing through the screen printing plate, thus causing clogging of the screen printing plate. As a result, thin spots or disconnection are created in the wiring, making it difficult to accurately form a fine pattern of less than or equal to 100 μm. In particular, when continuously printing for a long period of time, thin spots or disconnection are easily created in the wiring.

In the present invention, as the solvent contained in the organic vehicle, a solvent having a high boiling point is used that is soluble in resin, non-corrosive to the base material, and has a boiling point of 270° C. or higher. As such a solvent having a high boiling point, for example, alcohols such as glycerin (boiling point: 290° C.), 2-ethyl-2-(hydroxymethyl) 1, 3-propanediol (boiling point: 295° C.), 2-[2-[(2-ethyl-hexyl)oxy]ethoxy]ethanol (boiling point: 277° C.), esters such as dimethyl phthalate (boiling point: 282° C.), diethyl phthalate (boiling point: 295° C.), dibutyl phthalate (boiling point: 339° C.), dioctyl phthalate (boiling point: 284° C.), dibutyl tartrate (boiling point: 312° C.), dibutyl sebacate (boiling point: 345° C.), and ethers such as dibenzyl ether (boiling point: 295° C.) are preferable.

Such a solvent having a high boiling point does not easily evaporate or dry. Therefore, by using the solvent having a high boiling point, the desiccation resistance of the conductive paste is improved. Therefore, even if the proportion of the solid content such as the metal powder and the inorganic binder in the conductive paste is increased to increase the thickness of the coated film, increase in the viscosity of the conductive paste is effectively suppressed. As a result, when forming a fine pattern by screen printing, the conductive paste easily passes through the screen printing plate, and clogging of the screen printing plate is suppressed. This improves the printing characteristics, thus preventing thin spots or disconnection from being created in the wiring, and a fine pattern is accurately formed even when continuous printing is performed.

The solvent with a high boiling point may be used independently, or may be used with a solvent having a low boiling point. More specifically, as described above, in view of improving the desiccation resistance of the conductive paste so that a fine pattern is accurately formed and the thickness of the coated film is increased, the proportion of the solvent having a boiling point of 270° C. or higher is 3 to 100% by weight, preferably 10 to 80% by weight, and more preferably 20 to 70% by weight with respect to the entire solvent in the organic vehicle.

The content of the organic vehicle in the conductive paste is not limited, but may be adjusted in accordance with the printing method as required. For example, when printing a fine pattern having a line width of 100 μm or less by screen printing, the organic vehicle prepared by dissolving ethylcellulose having a molecular weight of 10000 to 20000 in a solvent by 10 to 20% by weight is preferable.

As the metal powder, one selected from elemental metals, alloys, and composite metals is used. The metal powder is preferably one or more types of metal or alloy selected from platinum, gold, silver, copper, nickel, and palladium. In particular, from the point of view of the conductivity and reliability, silver is more preferred. Also, the form of the metal powder is not limited, and spherical powder, flake powder, and the like may be used. Furthermore, the particle size of the metal powder is determined in accordance with the width and the thickness of the conductor wiring to be formed. The maximum particle size is preferably less than or equal to half the desired line width, and more preferably less than or equal to one third of the desired line width. The average particle size of the metal powder is preferably less than or equal to one fifth of the desired line width, and is more preferably less than or equal to one tenth of the desired line width.

Moreover, metal powder may be used in which two or more kinds of metal particles having different sizes are mixed at a certain ratio. For example, when using spherical powder as the metal powder, spherical particles (A) having an average primary particle size of 0.1 μm to 3 μm and spherical particles (B) having an average primary particle size of 50 nm or less are used. In this case, a commercially available product may be used for the spherical particles (A). The average primary particle size of the spherical particles (A) is preferably 0.1 μm to 3 μm, and more preferably 0.1 μm to 1 μm. The average particle size refers to 50% particle size ($D_{50}$). The average particle size is measured using a particle size distribution measuring instrument (Nanotrac (registered trade name) particle size distribution measuring instrument UPA-EX150 manufactured by NIKKISO CO., LTD.), which uses a laser Doppler method.

The spherical particles (B) are manufactured by a wet reduction of a metallic compound. More specifically, the spherical particles (B) are manufactured by adding and dissolving a water-soluble metallic compound in water or in a mixture of water and lower alcohol, then adding an aqueous solution in which a reducing agent and a finishing agent are dissolved, and stirring the resulting solution at a temperature of 30° C. or lower.

For example, when using silver powder, silver nitrate is dissolved in a solution made by mixing an equal amount of pure water and ethanol, and the resulting solution is adjusted to pH 11.3 with aqueous ammonia so that the solution becomes transparent. Separately, a reducing agent of L-ascorbic acid and a dispersant of polyacrylic acid are dissolved in a liquid made by mixing an equal amount of pure water and ethanol. The dispersant is used to slow down the precipitation reaction of silver fine particles caused by reductive reaction so as to prevent aggregation of the fine particles into large particles. Then, the above-mentioned solution containing the reducing agent and the dispersant is stirred while being maintained at 25° C., and a silver nitrate solution that is prepared in advance is gradually dropped in the solution. Accordingly, silver fine particles precipitate in the solution, and then the solution is washed to obtain spherical silver particles (B) having an average particle size of 20 nm. With regard to other metal powders, minute metal powders are obtained by the same operation.

As described above, in the case of using the metal powder prepared by mixing two kinds of spherical particles (A) and (B) having different sizes at a certain ratio, if the percentage of the spherical particles (B) contained in the entire metal powder is less than 1% by weight, the spherical particles (B) are not sufficiently spread around the spherical particles (A). Thus, the conductivity of the conductive path might not be sufficient. If the spherical particles (B) exceed 50% by weight of the entire metal powder, the spherical particles (A) are completely surrounded by the spherical particles (B), and sufficient conductivity is obtained. However, when the used amount of the spherical particles (B) is increased, the cost is increased. Therefore, it is preferable to use the spherical particles (A) in a range from 50 to 99% by weight of the entire metal powder and the spherical particles (B) in a range from 1 to 50% by weight of the entire metal powder, and it is more preferable to use the spherical particles (A) in a range from 90 to 97% by weight of the entire metal powder and the spherical particles (B) in a range from 3 to 10% by weight of the entire metal powder.

With this configuration, since the spherical particles (B) having a relatively small particle size fill between the spherical particles (A) having a relatively large particle size, the packing density of the metal powder is increased. As a result, high conductivity is obtained although the conductive paste is sintered at a low temperature (for example, 450° C. or lower), and the thickness of the coated film is increased. Also, when forming a fine pattern by screen printing, the density of the metal powder in the wiring is maintained more uniform. Therefore, a low density portion of the metal powder is not formed at a line edge portion of the fine pattern. This suppresses increase in the volume resistance of the wiring, and as a result, a fine pattern having high conductivity is formed. Furthermore, the costs are suppressed by mixing the spherical particles (A) and the spherical particles (B) in the above mentioned range. In view of securing conductivity, the content of the metal powder in the entire conductive paste is preferably 60% by weight or more.

Also, the viscosity ($V_{1rpm}$) of the conductive paste measured using an E-type rotational viscometer (TV-20 type cone-plate viscometer (TVE-20H) manufactured by TOKI SANGYO CO., LTD.) with a No. 7 rotor at 25° C. and at 1 rpm is preferably 400 Pa·s or more to 1200 Pa·s or less (preferably, 600 Pa·s or more to 1000 Pa·s or less). If the viscosity of the conductive paste is too high, the conductive paste does not easily pass through the screen printing plate when performing screen printing. Also, if the viscosity of the conductive paste is too low, the applied conductive paste easily sags. In either case, formation of a fine pattern becomes difficult.

The inorganic binder is used as a binder for improving adhesion of the pattern and the base material. The inorganic binder may be selected from commercially available products, and for example, a glass powder is used. Also, in consideration of environment, glass powder that does not contain lead is preferably used. As lead-free glass powder, bismuth glass powder may be used.

Since the particle size of the metal powder that is used is small, if the particle size of the glass powder is increased, segregation will easily occur, and as a result, the conductivity might be affected. Also, when forming a fine pattern by screen printing, since the screen printing plate having mesh with small openings is used, the glass powder might be clogged in the mesh. Therefore, the glass powder preferably has an average particle size of 1 μm or more to 5 μm or less, and a maximum particle size of 50 μm or less. Using such glass powder suppresses segregation, and achieves high dispersibility in the conductive paste. Thus, high conductivity is achieved, and the glass powder will not clog the mesh when forming a fine pattern. The glass powder having a desired particle size is manufactured in a suitable manner by, for example, wet milling using a bead mill, and the like.

The proportion of the glass powder may be extremely small. In this case, in view of securing adhesion between the conductive paste and the base material, the proportion of the glass powder is preferably 0.1% by weight or more to 15% by weight or less with respect to the total value of the metal powder and the glass powder. Also, in view of satisfying both low-temperature sintering capability and the conductivity, an operation point which serves as an index of the temperature at which the glass powder melts and spreads is preferably 450° C. or lower. The operation point refers to a temperature at which the glass powder softens to a predetermined viscosity (approximately $10^4$ Pa·s) when heated and the temperature is increased.

Also, in order to effectively suppress shrinkage of the coated film during drying and sintering, and to increase the thickness of the coated film, the content of a solid component in the conductive paste (the metal powder and the inorganic binder) needs to be increased. Therefore, the total content of the metal powder and the inorganic binder with respect to the entire conductive paste is preferably 80% by weight or more, and more preferably 85% by weight or more.

Also, to adjust the rheology of the conductive paste, various types of additives such as a thixotropy agent, a leveling agent, and a plasticizer, which are conventionally used for the conductive paste, may be used. For example, the desiccation resistance is an important property when continuously printing using, for example, screen printing. In this case, the plasticizer improves the desiccation resistance of the conductive paste. As the plasticizer, for example, a phthalate derivative, an isophthalate derivative, a tetrahydrophthalate derivative, an adipic acid derivative, a maleic acid derivative, a fumaric acid derivative, a trimellitate derivative, a pyromellitic derivative, a stearic acid derivative, an oleic acid derivative, an itaconic acid derivative, a ricinoleic derivative, hydrogen added castor oil and its derivative are preferable. Among the plasticizers that are used, in view of improving the desiccation resistance, phthalate plasticizers such as a phthalate derivative, an isophthalate derivative, and a tetrahydrophthalate derivative are particularly preferred. More specifically, as the phthalate derivative, for example, dimethyl phthalate, diethyl phthalate, dibutyl phthalate, di-(2-ethylhexyl) phthalate, dioctylphthalate, di-iso-octyl phthalate, di-isobutyl phthalate, diheptyl phthalate, diphenyl phthalate are preferred, and as the isophthalate derivative, for example, dimethyl isophthalate is preferred. The content of the plasticizer with respect to the entire conductive paste is preferably 0.1% by weight or more to 3% by weight or less, and more preferably 0.3% by weight or more to 3% by weight or less.

Also, the conductive paste of the present invention is preferable when, for example, forming, on the base material (such as glass base material), an electric circuit configured by wiring and electrodes with excellent shape accuracy. More specifically, by printing the conductive paste of the present invention in a predetermined pattern on the base material using a known printing method (in particular, preferably screen printing), and baking the conductive paste at a high temperature, a wiring board is obtained that includes an electric circuit configured by desired wiring and electrodes.

Also, by using the conductive paste of the present invention, the desiccation resistance of the conductive paste is improved, and a fine pattern is accurately formed. Thus, the conductive paste of the present invention is preferable when forming a fine pattern having a line width of 100 μm or less.

EXAMPLES

The present invention will now be described based on Examples and Comparative Examples. The present invention is not limited to these Examples. Also, these Examples may be changed or modified based on the spirit of the present invention, and the changes and modifications are not excluded from the scope of the present invention.

Examples 1 to 4, Comparative Example 1 and 2

Solutions of an organic vehicle having a resin concentration of 11% by weight were prepared by dissolving ethylcellulose (having a molecular weight of 18000) of the amount shown in Table 1 in solvents of the type and in the amount shown in Table 1 while heating. Then, silver powder of the type and in the amount shown in Table 1 was added to these solutions, and was uniformly mixed using a rotary agitating deaerator. Furthermore, glass powder of the type and in the amount shown in Table 1 was added to and mixed with these solutions. Then, the conductive pastes shown in Examples 1 to 4 and Comparative Examples 1 and 2 of Table 1 were prepared from these solutions, which are uniformly mixed using a triple roll mill. The conductive pastes of Examples 1 to 4 and Comparative Examples 1 and 2 did not show any abnormality in the appearance in the normal state. Also, in Examples 1 to 4, the total content of the silver powder and the glass powder with respect to the entire conductive paste was 86.2% by weight.

(Measurement of Initial Viscosity and Initial Weight)

Next, the initial viscosity of each conductive paste at 1 rpm was measured. The viscosity of the conductive paste was measured using an E-type rotational viscometer (TV-20 type cone-plate viscometer (TVE-20H) manufactured by TOKI SANGYO CO., LTD.) with a No. 7 rotor at a room temperature (25° C.). Also, each conductive paste was applied on a glass base material (PD200 manufactured by ASAHI GLASS CO., LTD.), and the initial weight of each conductive paste was measured. The conductive paste was applied such that the coated area was 80 cm$^2$ and the film thickness was 150 μm, and the drying characteristics of each conductive paste was evaluated.

(Calculating Rate of Viscosity Increase and Decreased Amount of Weight)

Next, the glass base materials on which the conductive pastes were applied were put in a draft and left for 30 minutes. After drying the conductive pastes, the viscosity and the weight of each conductive paste at 1 rpm was measured, and the rate of viscosity increase with respect to the initial viscosity and the decreased amount of weight with respect to the initial weight were calculated. In this case, the temperature in the draft was set to 25° C., the humidity in the draft was set to 20%, and the exhaust wind speed at 5 cm directly above the glass base material on which each conductive paste is applied was set to 0.5 m/s.

(Printability Evaluation)

Next, the conductive pastes of Examples 1 to 4 and Comparative Examples 1 and 2 were continuously printed on a glass base material (PD200 manufactured by ASAHI GLASS CO., LTD.) using a screen printer (LS-150TVA manufactured by NEWLONG). Then, the printing characteristics (wiring formation properties) of each conductive paste when printed on the base material with a predetermined fine pattern were evaluated. In this process, a screen printing plate (manufactured by TOKYO PROCESS SERVICE Co., Ltd.) with a SUS500 mesh (having a diameter of 18 mm and an aperture of 33 μm) was used. More specifically, a screen printing plate that has a line pattern with a line width of 30 μm and a screen printing plate that has a line pattern with a line width of 50 μm were used (The line widths are design values of the screen printing plate). The line pattern of both screen printing plates have a line interval of 100 μm and a line length of 25 mm. Then, using an optical microscope (MZ12 manufactured by LEICA), the printing characteristics of the conductive pastes when printed on the glass base material with each line width were evaluated. More specifically, printing defects (thin spots and disconnection of the wiring) were observed. Each conductive paste was continuously printed on fifty pieces of the glass base materials with each line width. 1 represents the evaluation result that the above-mentioned printing defect was not found, and the printability was satisfactory, and 2 represents the evaluation result that the above-mentioned printing defect was found, and the printability was poor. The magnification of the optical microscope was set to 157.5 times for the wiring with a line width of 30 μm, and 125 times for the wiring with a line width of 50 μm. The results are shown in Table 1.

As seen in Table 1, with regard to the conductive pastes of Examples 1 to 4, although continuous printing was performed by screen printing, thin spots and disconnection of the wiring were not found and a fine pattern with excellent shape accuracy was formed, and the conductive pastes had excellent printing characteristics. As for Comparative Example 1, when printing with a line width of 50 μm, satisfactory wiring was formed, but when printing with a line width of 30 μm, the wiring started to have thin spots when printing a sixteenth piece of the base material, and satisfactory wiring was not formed. Also, as for Comparative Example 2, the wiring started to have thin spots during printing of the fourth piece of the base material when the line width was 30 μm, and during printing of the eleventh piece of the base material when the line width was 50 μm, and satisfactory wiring was not formed.

This is because, in the cases of Examples 1 to 4, the conductive pastes contain a high boiling point solvent that has low volatility and is not easily dried, and has a boiling point of 270° C. or higher. Thus, as shown in Table 1, as compared to the cases of Comparative Examples 1 and 2, the decreased amount of weight with respect to the initial weight was reduced, thus improving the desiccation resistance of the conductive pastes. That is, in the cases of Examples 1 to 4, the rate of viscosity increase with respect to the initial viscosity was effectively suppressed as compared to Comparative Examples 1 and 2. As a result, when forming a fine pattern by continuously printing by screen printing, the conductive pastes easily passed through the screen printing plate, and clogging of the screen printing plate did not occur.

TABLE 1

| | | | E. 1 | E. 2 | E. 3 | E. 4 | C. E. 1 | C. E. 2 |
|---|---|---|---|---|---|---|---|---|
| Composition | Organic Vehicle | Ethylcellulose *1 | 1.6 | 1.6 | 1.6 | 1.6 | 1.6 | 1.6 |
| | | Solvent A *2 | 13.6 | 11.2 | 11.2 | | 11.2 | 14.4 |
| | | Solvent B *3 | | | | 11.2 | 3.2 | |
| | | Solvent C *4 | 0.8 | 3.2 | | 3.2 | | |
| | | Solvent D *5 | | | 3.2 | | | |
| | Metal Powder | Silver Powder *6 | 95 | 95 | 95 | 95 | 95 | 95 |
| | | Silver Powder *7 | 4 | 4 | 4 | 4 | 4 | 4 |
| | Glass Powder (Lead Free) | Sample A *8 | 1 | 1 | 1 | 1 | 1 | 1 |
| | Proportion (%) of solvent having a boiling point of 270° C. or higher with respect to the entire solvent | | 5.5 | 22.2 | 22.2 | 22.2 | 0 | 0 |
| | Content (%) of metal powder and glass powder with respect to the entire conductive paste | | 86.2 | 86.2 | 86.2 | 86.2 | 86.2 | 86.2 |
| Characteristics | Viscosity Characteristics | Initial Viscosity at 1 rpm (Pa·s) | 632 | 579 | 520 | 487 | 613 | 685 |
| | | Viscosity at 1 rpm after standing 30 min. (Pa·s) | 935 | 816 | 678 | 616 | 1035 | 2025 |
| | | Rate of viscosity increase (%) | 48 | 41 | 30 | 26 | 69 | 196 |
| | Drying Characteristics | Initial Weight (mg) | 2903.3 | 2991.5 | 3268.4 | 2847.7 | 2961.7 | 2898.4 |
| | | Weight after standing 30 min. (mg) | 2880.4 | 2971.5 | 3253.7 | 2838.2 | 2933.8 | 2859.0 |
| | | Decreased amount of weight (mg/cm²) | 0.3 | 0.3 | 0.2 | 0.1 | 0.4 | 0.5 |
| | Printability Evaluation | 30 μm width | 1 | 1 | 1 | 1 | 2 | 2 |
| | | 50 μm width | 1 | 1 | 1 | 1 | 1 | 2 |

*1: MW: 18000
*2: terpineol (boiling point: 219° C.)
*3: 2-(2-butoxyethoxy)ethyl acetate (boiling point: 247° C.)
*4: 2-(2-[(2-ethylhexyl)oxy]ethoxyl ethanol (boiling point: 277° C.)
*5: diethyl phthalate (boiling point: 295° C.)
*6: spherical, average primary particle size: 0.5 μm
*7: spherical, average primary particle size: 20 nm
*8: average particle size: 1.2 μm, operation point: 425° C.

INDUSTRIAL APPLICABILITY

Application of the present invention includes, a conductive paste used when forming a conductor wiring on a substrate, and a wiring board obtained by using the conductive paste.

The invention claimed is:

1. A conductive paste comprising:
   a metal powder,
   an inorganic binder, and
   an organic vehicle as main ingredients, wherein:
   the organic vehicle includes a first solvent having a boiling point of 270° C. or higher and a second solvent having a boiling point less than 270° C., and
   the proportion of the first solvent with respect to the entire solvent included in the organic vehicle is 3% to 80% by weight.

2. The conductive paste according to claim 1, wherein the total content of the metal powder and the inorganic binder with respect to the entire conductive paste is 80% by weight or more.

3. The conductive paste according to claim 1 wherein:
   the metal powder includes powder having an average primary particle size of 50 nm or less, and
   the proportion of the powder is 1% to 50% by weight of the entire metal powder.

4. The conductive paste according to claim 1, wherein the metal powder is one or more types of metal or alloy selected from the group consisting of platinum, gold, silver, copper, nickel, and palladium.

5. The conductive paste according to claim 1, wherein:
   the inorganic binder is glass powder, and
   the glass powder does not include lead.

6. A wiring board comprising wiring formed by printing the conductive paste according to claim 1.

7. The wiring board according to claim 6, wherein a line width of the wiring is 100 μm or less.

* * * * *